(12) United States Patent
Hebras

(10) Patent No.: US 8,389,380 B2
(45) Date of Patent: Mar. 5, 2013

(54) METHOD FOR MAKING A SUBSTRATE OF THE SEMICONDUCTOR ON INSULATOR TYPE WITH AN INTEGRATED GROUND PLANE

(75) Inventor: Xavier Hebras, Grenoble (FR)

(73) Assignee: Soitec, Bernin (FR)

( * ) Notice: Subject to any disclaimer, the term of this patent is extended or adjusted under 35 U.S.C. 154(b) by 512 days.

(21) Appl. No.: 12/678,482

(22) PCT Filed: Oct. 10, 2008

(86) PCT No.: PCT/EP2008/063679
§ 371 (c)(1),
(2), (4) Date: Mar. 16, 2010

(87) PCT Pub. No.: WO2009/047351
PCT Pub. Date: Apr. 16, 2009

(65) Prior Publication Data
US 2010/0207236 A1    Aug. 19, 2010

(30) Foreign Application Priority Data

Oct. 12, 2007 (FR) .................................. 07 07184

(51) Int. Cl.
*H01L 21/30* (2006.01)
(52) U.S. Cl. ........ 438/455; 438/456; 438/457; 438/458; 438/459; 438/460; 438/461; 438/462; 438/463; 438/464; 438/465
(58) Field of Classification Search ........... 438/455–465
See application file for complete search history.

(56) References Cited

U.S. PATENT DOCUMENTS

| 4,816,421 | A | 3/1989 | Dynes et al. ..................... 437/26 |
| 5,387,555 | A | 2/1995 | Linn et al. ...................... 437/225 |
| 5,985,739 | A | 11/1999 | Plettner et al. ................. 438/455 |
| 6,391,752 | B1 | 5/2002 | Colinge et al. ................. 438/585 |
| 2007/0072391 | A1 | 3/2007 | Pocas et al. .................... 438/455 |
| 2007/0170503 | A1 | 7/2007 | Allibert et al. ................. 257/347 |

FOREIGN PATENT DOCUMENTS

| EP | 0 271 232 B1 | 6/1988 |
| EP | 0 553 853 B1 | 8/1993 |
| FR | 2 864 336 A1 | 6/2005 |
| FR | 2 896 618 | 7/2007 |

OTHER PUBLICATIONS

International Search Report, Application No. PCT/EP2008/063679, Dec. 3, 2008.

(Continued)

*Primary Examiner* — Samuel Gebremariam
(74) *Attorney, Agent, or Firm* — Winston & Strawn LLP

(57) ABSTRACT

A method for making a semiconductor on insulator (SeOI) type substrate that includes an integrated ground plane under the insulating layer wherein the substrate is intended to be used in making electronic components. This method includes implanting atoms or ions of a metal in at least one portion of a semiconducting receiver substrate, carrying out a heat treatment of the receiver substrate in order to obtain an integrated ground plane on or in at least one portion of that receiver substrate, transferring an active layer stemming from a semiconducting donor substrate onto the receiver substrate, with an insulating layer being inserted in between the donor and receiver substrates to obtain the substrate with an integrated ground plane.

19 Claims, 4 Drawing Sheets

OTHER PUBLICATIONS

Bain et al., "Electrical Characterization of SOI Substrates Incorporating $WSi_x$ Ground Planes," IEEE Electron Device Letters, 26(2):72-74 (2005).

Dehan et al., "Intérêts de la Technologie CMOS SOI pour les Applications Micro-ondes Faible Tension Faible Consommation," 3ème Journées Francophones d'Etudes Faible Tension Faible Consommation (FTFC '01), pp. 63-72 (May 30-31-Jun. 1, 2001) (English translation not available).

Fenouillet-Beranger et al., "Requirements for ultra-thin-film devices and new materials on CMOS Roadmap," 2003 IEEE International SOI Conference, pp. 145-146 (Sep. 29-Oct. 2, 2003).

Fujiwara et al., "Impact of BOX Scaling on 30 nm Gate Length FD SOI MOSFETs," 2005 IEEE International SOI Conference, pp. 180-182 (Oct. 3-6, 2005).

Jurczak et al., "Silicon-on-Nothing (SON)—an Innovative Process for Advanced CMOS," IEEE Transactions on Electron Devices, 47(11):2179-2187 (Nov. 2000).

Gallon et al., "Ultra-Thin Fully Depleted SOI Devices with Thin BOX, Ground Plane and Strained Liner Booster," 2006 IEEE International SOI Conference, pp. 17-18 (Oct. 2-5, 2006).

Xiong et al., "Influence of Fluorine Implant on Threshold Voltage for Metal Gate FDSOI and MuGFET," 2007 IEEE International SOI Conference, pp. 35-36 (Oct. 1-4, 2007).

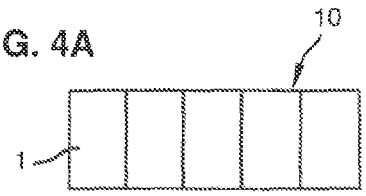
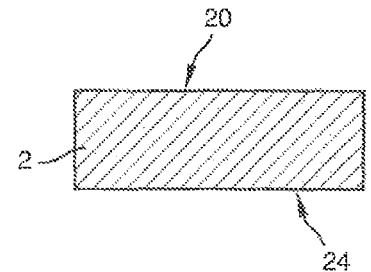
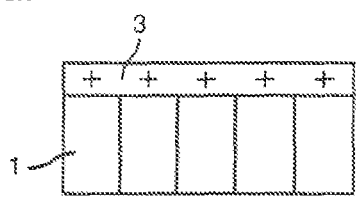
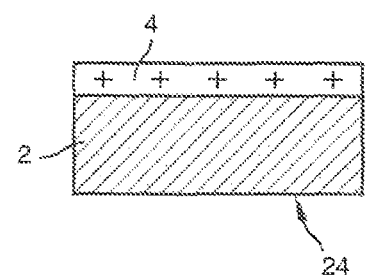
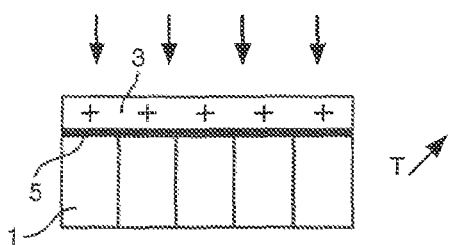
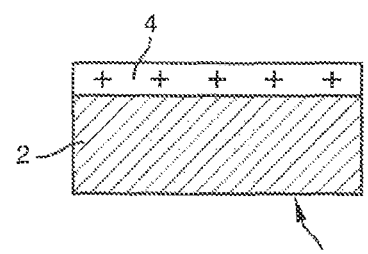
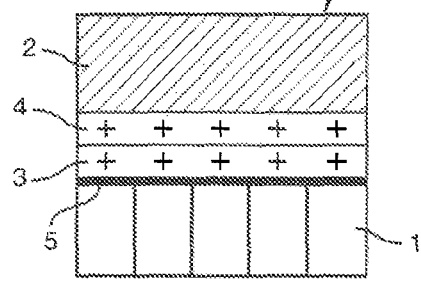
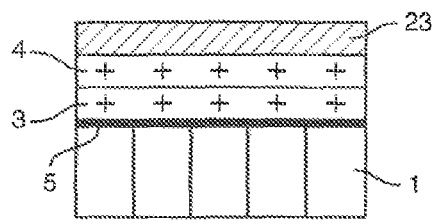

FIG. 5A
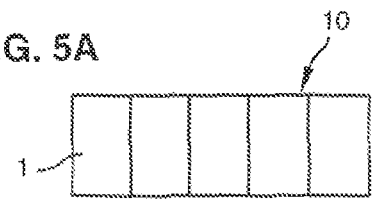
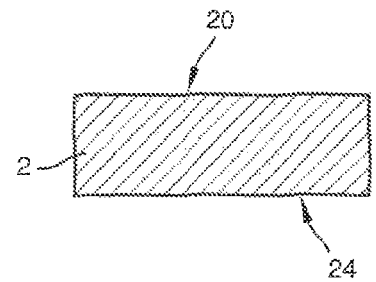
FIG. 5B
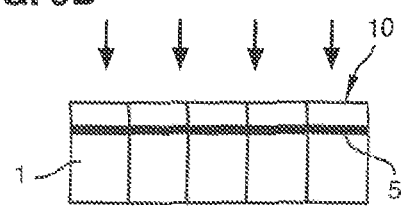
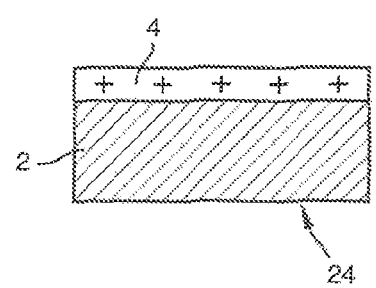
FIG. 5C
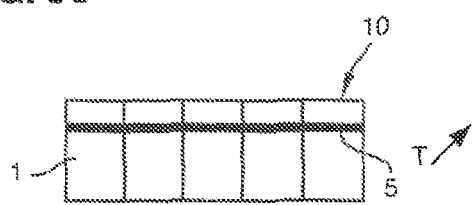
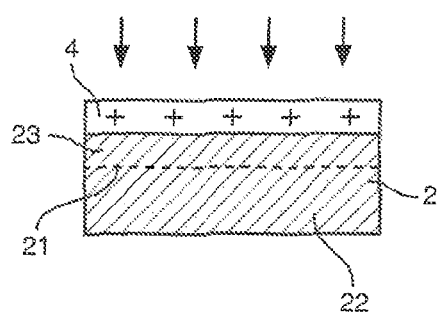
FIG. 5D
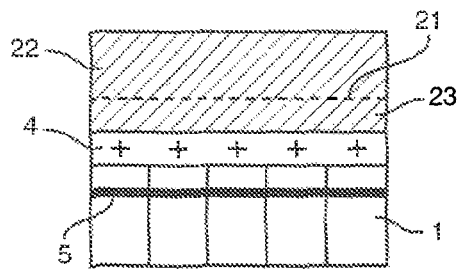
FIG. 5E
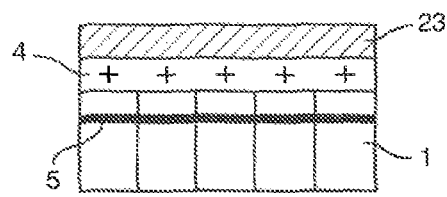

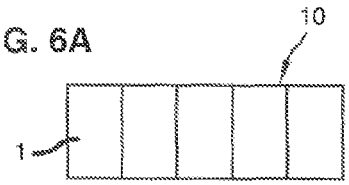
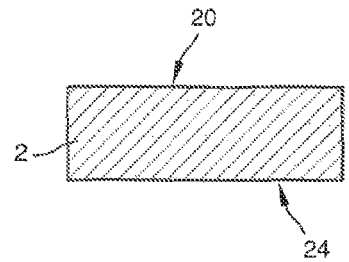
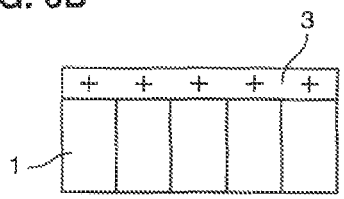
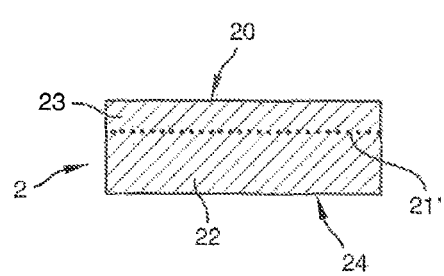
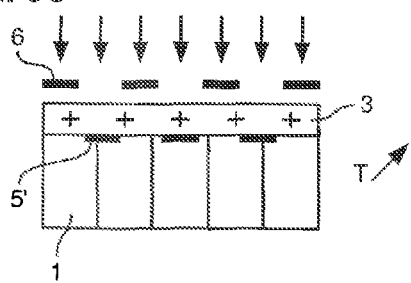
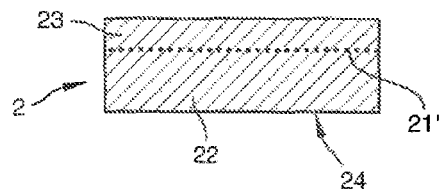
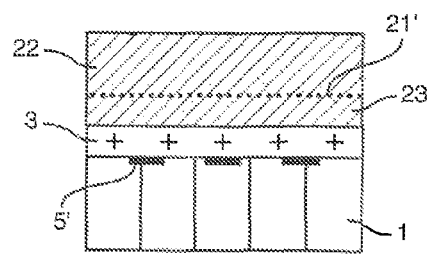
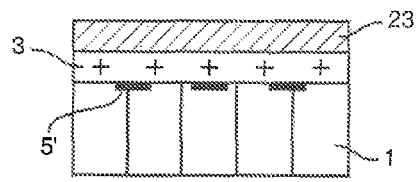

METHOD FOR MAKING A SUBSTRATE OF THE SEMICONDUCTOR ON INSULATOR TYPE WITH AN INTEGRATED GROUND PLANE

This application is a 371 filing of International Patent Application PCT/EP2008/063679 filed Oct. 10, 2008.

BACKGROUND

The present invention relates to a method for making a substrate of the "semiconductor on insulator" type comprising an integrated ground plane, this substrate being intended to be used in the making of electronic components.

A substrate of the "semiconductor on insulator" type, also known under the acronym SeOI (Semiconductor On Insulator) comprises a layer of insulating material buried between two semiconducting material layers.

As a reminder, the structure of a field effect transistor will now be described with reference to the appended FIG. 1, which schematically illustrates a substrate on which a transistor has been created.

With reference to this figure, it may be seen that the transistor comprises a substrate W inside which a source S, a drain D and a gate G have been formed. The passing of the current between the source S and the drain D is controlled according to the voltage applied to the gate G. The space extending between the source and the drain is called the channel C.

FIG. 2 schematically illustrates a substrate W', known under the acronym SOI (Silicon On Insulator), on which a transistor has been formed. The insulator layer I is located immediately under the source S and the drain D, themselves formed in the active silicon upper layer A of the substrate W'.

By using a substrate of the SOI type instead of a substrate in bulk silicon as the one illustrated in FIG. 1, the performances of the electronic components may be improved, in particular for CMOS technologies. By the presence of a buried oxide insulating layer I in the substrate, it was actually possible to:

reduce the multiple parasitic couplings existing between several circuits made on a same substrate W' and, improve the performances of CMOS circuits operating at high frequency.

The increasing reduction in the dimensions of the electronic components, the increase in their integration density and the significant increase in the communication rate between the source and the drain have led to the development of increasingly smaller components, which has also resulted in a reduction of the length of the channel C extending between the source S and the drain D.

Now, the reduction of the dimension of this channel leads to the occurrence of a so-called "short channel effect" phenomenon, known under the acronym of SCE (Short Channel Effect), i.e. upon occurrence of an electrostatic field between the source S and drain D which interferes with the displacement of the electrons between both of these elements.

By using transistors known to one skilled in the art under the acronym of MOS PD (Metal Oxide Silicon Partially Depleted), in which the thickness of the active silicon layer A is larger than the maximum depletion depth in the channel, the performances of standard transistors on SOI may be improved by reducing the dimension of the space charge areas associated with the source and with the drain of the transistor.

By using MOS transistors, made on SOI type substrates with a thin silicon film, also known to one skilled in the art as MOS FD (Metal Oxide Silicon Fully Depleted) transistors, it was possible to further reduce the short channel effects and to obtain good electric characteristics of thin transistor, even at a low operating voltage. These FD transistors are obtained by reducing the thickness of the active silicon layer A to a value less than the width of the depletion area, i.e. the space charge area generated by migration of the minority carriers in the channel C.

With substrates of this type, the risks of current passing between the source S and the drain D of the transistor are very limited, or even suppressed and the variation of the threshold voltage related to the reduction in the length of the channel C is highly reduced. Other short channel effects, such as the modulation of the length of the channel and the reduction of the potential barrier of the channel by the drain known to one skilled in the art under the acronym DIBL (Drain Induced Barrier Lowering) are also less significant in MOS SOI FD devices than in the so-called Partially Depleted (PD) ones.

The dimensional reduction in the size of the components and therefore in the length of the channel induces a lowering of the potential barrier between the source and the drain resulting from the superposition of the space charge areas of the source junctions and of that of the drain. The threshold voltage of the transistor then decreases. This effect is known under the name of <<short channel effect>>. This effect is independent of the source-drain voltage applied to the transistor. It only depends on the length of the gate of the transistor. On the other hand, if the source-drain voltage is increased, the threshold voltage reduction will be amplified due to the short channel effect: the barrier will be further reduced. It is this amplification of the threshold voltage reduction which is called DIBL.

A further way for improving the capabilities of the field effect transistors and especially for significantly reducing the short channel effects consists of making the transistor on an SOI type substrate, the buried oxide layer of which is of a small thickness. Reference may be made on this subject to the article of Fenouillet Beranger; "*Requirements for ultra-thin-film devices and new materials on CMOS Roadmap*"; IEEE 2003.

Thus, with an SOI type substrate, in which the oxide layer I is of the order of 20 nm and the upper silicon film of 5 nm, the short channel effects may be completely suppressed. Reference may be made on this subject to the article of Furczak et al; "*Silicon-on-Nothing (SON)—an Innovative Process for advanced CMOS*", IEEE TED, Vol. 47, No. 11, November 2000.

However, if the thickness of the insulated layer I is strongly reduced, for example by using substrates of the thin buried oxide layer type, known under the acronym of "thin BOX", or even with an ultra thin oxide layer, known under the acronym "UTBOX" (Ultra Thin Buried Oxide), the electrostatic field extends right into the bulk portion of the substrate located below the insulating layer I, which is detrimental to proper operation of the transistor because this phenomenon causes dispersion of the threshold voltage of the transistor.

A known solution to one skilled in the art for avoiding the leaking of electrons into the bulk portion of the substrate consists of forming a ground plane under the insulating layer of the substrate.

Such an exemplary substrate, referenced as W", is illustrated in the appended FIG. 3. The ground plane bearing the reference GP is formed under the insulating layer I.

From the article of Gallon et al; "*Ultra-Thin Fully Depleted SOI Devices with Thin BOX, Ground Plane and Strained Liner Booster*", IEEE SOI 2006, a method is already known for making a ground plane which consists of doping the bulk portion of the substrate by implantation. In this case, implantation is accomplished over the whole surface of the substrate, in order to create a continuously buried ground plane GP, under the totality of the electronic component. It appears that the thinner is the thickness of the insulating layer I, and more the doping step by implantation with phosphorus for p-MOS type transistors or with boron for n-MOS type transistors is facilitated.

From document U.S. Pat. No. 6,391,752, a method is also known which consists of doping by implantation exclusively the area located under the channel and not the areas located under the source or under the drain of the component.

The method consists of forming a sacrificial layer on an SOI substrate, of forming in said sacrificial layer a window, through which one proceeds with doping, and then of forming the gate in said window.

This method has the disadvantage of being costly because it requires many manufacturing steps (masking, etching, implanting, depositing different layers). Further, the use of ionic implantation of dopants in order to produce the ground plane, is limited by the limiting solubility of the dopants in the silicon layer. This limit imposes a restriction on the conductivity which may be attained and therefore on the efficiency of the ground plane. Finally, the disadvantage of using a ground plane obtained by ionic implantation after forming the components, as described in document U.S. Pat. No. 6,391,752, is that this implantation generates defects in the oxide and in the substrate which will then limit the effect of the ground plane.

Finally, another method consists of forming a metal layer instead of ionic implantation of the dopants. With this solution it is possible to have a ground plane having significant conductivity and therefore more efficient as compared with the implantation of dopants.

The known methods of the prior art have disadvantages and lead to limitations. They require the addition of many costly steps in the line for making the transistor. Further, the ground plane made by dopant implantation after making the transistor will have geometrical and electrical properties limited by the ionic implantation technology (solubility limit of the dopants, limit of the depth-thickness pair of the active layer since the implantation energy parameter involves depth but also imposes that the implantation profile be flared).

SUMMARY OF THE INVENTION

The object of the invention is to get rid of the aforementioned drawbacks and notably to provide a method for making a substrate comprising a ground plane integrated in situ, at the desired depth and the nature of which is adapted depending on the future components which will subsequently be made on this substrate. This technique also has the advantage of being much less costly than producing a ground plane during the making of the components.

For this purpose, the invention relates to a method for making a substrate of the semiconductor on insulator (SeOI) type, comprising a ground plane integrated under the insulating layer, this substrate being intended to be used for making electronic components.

According to the invention, it comprises the steps of:
implanting atoms and/or ions of at least one metal, in at least one portion of a so-called "receiver" substrate in a semiconducting material,
carrying out a heat treatment of said receiver substrate, in order to obtain an alloy of said semiconducting material and of one or more of the implanted metals, in order to form an integrated ground plane on or in at least one portion of said receiver substrate, transferring an active layer stemming from a so-called "donor" substrate in a semiconducting material, onto said receiver substrate, at least one layer of insulating material being inserted in between said donor and receiver substrates, so as to obtain said substrate of the semiconductor on insulator type with an integrated ground plane.

According to other advantageous and non-limiting features of the invention, either taken alone or combined:
the implanted metal is a refractory metal;
the implanted metal is selected from cobalt, nickel, titanium, molybdenum, tungsten and tantalum;
the atoms and/or ions of said metal are implanted with a dose comprised between $1 \cdot 10^{14}$ at/cm$^2$ and $1 \cdot 10^{16}$ at/cm$^2$ and an energy comprised between 50 keV and 1,500 keV;
said heat treatment for forming the integrated ground plane is carried out at a temperature larger than or equal to 900° C. and less than or equal to 1,100° C., for at least one minute;
said heat treatment for forming the integrated ground plane (5, 5') is carried out under a neutral atmosphere.
the implantation parameters of said metal are selected so that the integrated ground plane formed in said receiver substrate extends from one of the faces of the latter, a so-called "front face";
the implantation parameters of said metal are selected so that the integrated ground plane formed in said receiver substrate extends in the depth of the latter;
the implantation of said metal is achieved through a mask, so as to form an integrated ground plane appearing as a plurality of islands;
the implantation of said metal is achieved on the whole surface of the receiver substrate, so as to form an integrated ground plane, the circumference of which is identical with that of said receiver substrate;
an insulator layer is formed or deposited on the donor substrate before transferring the active layer on said receiver substrate;
an insulator layer is formed or deposited on the receiver substrate before implanting metal atoms and/or ions intended to form the integrated ground plane;
said insulating material is selected from silicon oxide (SiO$_2$), silicon nitride (Si$_3$N$_4$) or a silicon oxynitride Si$_x$O$_y$N$_z$;
the transfer of the active layer is carried out by bonding the donor substrate by molecular adhesion onto the receiver substrate and by submitting its free so-called "rear" face to mechanical and chemical thinning and/or ionic etching, so as to reduce the thickness of said donor substrate until said active layer is obtained;
the transfer of the active layer is carried out by bonding the donor substrate inside which a porous area has been laid out, onto the receiver substrate by molecular adhesion and by submitting said donor substrate to the application of stresses in order to detach a so-called "remainder" portion therefrom and to only keep on said receiver substrate, the other portion forming said active layer;
the transfer of the active layer is carried out by achieving an implantation of atomic and/or ionic species in said donor substrate, so as to form an embrittlement area therein and then by bonding said implanted donor substrate by molecular adhesion onto the receiver substrate and by applying stresses to said donor substrate, so as detach a so-called "remainder" portion therefrom and to only keep on the said receiver substrate, the other portion forming said active layer;

the donor substrate and the receiver substrate consist of at least one semiconducting material selected from silicon (Si), silicon carbide (SiC), germanium (Ge), gallium nitride (GaN) and gallium arsenide (AsGa).

the donor substrate and the receiver substrate are in silicon and in that the insulator is in silicon oxide ($SiO_2$);

the thickness of the insulator layer in the final substrate does not exceed 50 nanometers, so as to obtain a substrate with a buried ultra thin insulator layer of the UTBOX type.

The invention also relates to a substrate of the silicon on insulator SOI type comprising an insulating material layer inserted in between a silicon receiver substrate and an active silicon layer. According to the invention it comprises an integrated ground plane extending within said silicon receiver layer, this integrated ground plane being made in silicide.

Preferably, this integrated ground plane is made in a material selected from cobalt silicide, nickel silicide, titanium silicide, molybdenum silicide, tungsten silicide and tantalum silicide.

BRIEF DESCRIPTION OF THE DRAWINGS

Other features and advantages of the invention will become apparent from the description which will now be made, with reference to the appended drawings, which illustrate, as an indication but not as a limitation, different possible embodiments thereof.

In these drawings:

FIGS. 4A-4E, 5A-5E and 6A-6E are diagrams illustrating the different steps of three alternative embodiments of the method according to the invention.

Figure 1:
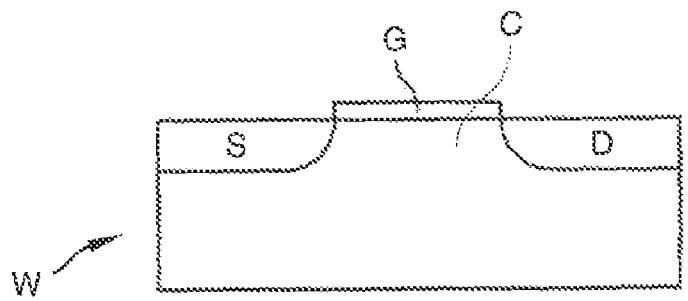
FIGS. 1-3 are diagrams illustrating substrates supporting field effect transistors made according to methods in accordance with the state of the art.
Figure 2:
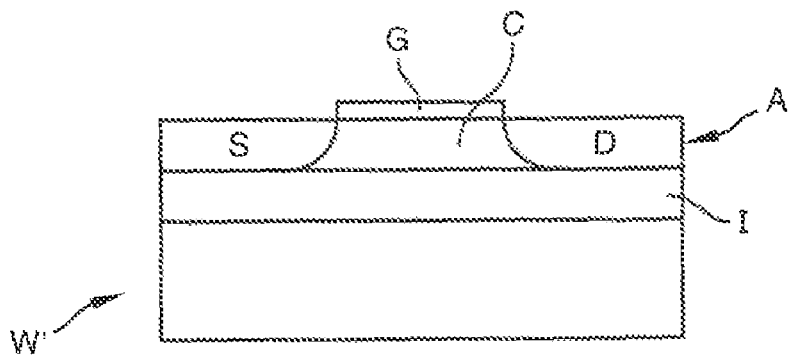
Figure 3:
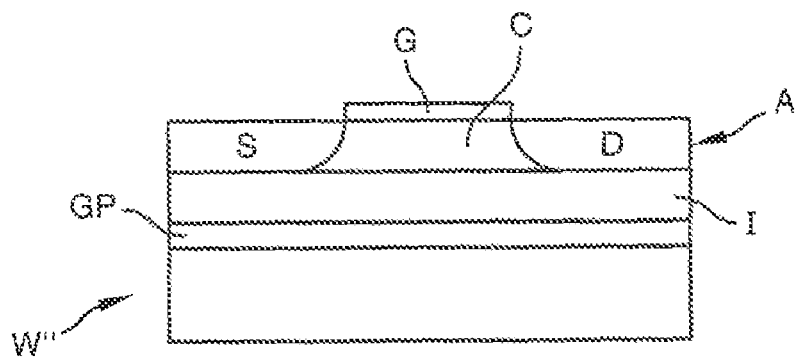

In these figures, the different layers are not illustrated to scale.

DETAILED DESCRIPTION OF THE INVENTION

A first alternative of the method according to the invention will now be described with reference to FIGS. 4A-4E.

A receiver substrate 1 and a donor substrate 2 may be seen in FIG. 4A.

Both of these substrates 1 and 2 are made in semiconducting materials, preferably selected from silicon (Si), silicon carbide (SiC), germanium (Ge), gallium nitride (GaN) and gallium arsenide (AsGa).

A preferred embodiment of the invention uses two donor and receiver silicon substrates.

Both of these substrates 1 and 2 may be monolayered, as illustrated in the figures, or optionally be multilayered. In the latter case, the substrates then include several layers of semiconducting materials.

In FIG. 4B, it may be seen that the receiver 1 and donor 2 substrates are then covered with an insulator layer 3, 4 respectively, formed or deposited on one of their so-called "front" faces 10, 20 respectively.

The methods for preparing these insulator layers 3 and 4 will be described subsequently.

The rear face of the donor substrate 2 bears the reference 24.

As illustrated in FIG. 4C, the receiver substrate 1 is then subjected to implantation of atoms and/or ions from a metal. Preferably, this metal is refractory, still preferably selected from cobalt (Co), nickel (Ni), titanium (Ti), molybdenum (Mo), tungsten (W) and tantalum (Ta), and then subject to a suitable heat treatment in order to define inside the receiver substrate 1 a ground plane 5. The latter, when the substrate 1 is in silicon, will be a silicide of the type: cobalt silicide $CoSi_x$, nickel silicide $NiSi_x$, titanium silicide $TiSi_x$, molybdenum silicide $MoSi_x$, tungsten silicide $WSi_x$ or tantalum silicide $TaSi_x$ with $1<x<2$. The methods for applying this step will be described in more detail later on.

One then proceeds with bonding both substrates 1 and 2 to each other by molecular adhesion, so that the insulating material layers 3 and 4 are inserted in between them (see FIG. 4D).

Finally, the donor substrate 2 is subjected through its rear face 24 to a mechanical thinning step (known as "grinding") followed by chemical and/or ionic etching, until a layer of smaller thickness, designated as active layer 23, is obtained.

On this subject, reference may be made to the method known to one skilled in the art under the acronym BESOI (Bonded Etched Back Silicon On Insulator), which means that silicon is bonded and etched on an insulator.

A description of this method appears in the book "*Silicon wafer bonding technology for VLSI and MEMS applications*", S. S. Lyer and A. J. Auberton-Hervé, IEEE (2002).

Two other alternative embodiments of the invention will now be described with reference to FIGS. 5 and 6, in which the elements identical with those of the first embodiment bear the same numerical references.

The alternative embodiment illustrated in FIG. 5 differs from the embodiment of FIG. 4 by how the active layer 23 is transferred onto the receiver substrate on the one hand and by the position of the ground plane 5 on the other hand.

In FIG. 5C, it may be seen that the donor substrate 2 covered with the insulator layer 4, is subject to a step for implanting atomic and/or ionic species, intended to form an embrittlement area 21 thereon.

This embrittlement area 21 delimits the active layer 23 from the remainder 22 of the donor substrate.

On this subject, reference may be made to the literature describing the implantation step of the method known to one skilled in the art under the name of Smart Cut™.

The step for detaching the remainder 22, illustrated in FIG. 5E, is carried out by applying a stress of mechanical, thermal and/or chemical origin in a way well-known to one skilled in the art. As an example, a heat treatment between 200° C. and 500° C. may be used.

Moreover, the step for forming the ground plane 5 is conducted with an implantation energy such that this ground plane is formed no longer immediately under the front face 10 of the receiver substrate 1, as illustrated in FIG. 4C, but at a certain depth inside the latter.

Further, in FIGS. 5B and 5C, it may be seen that the receiver substrate 1 is not covered with the insulator layer 3. This layer is optional. But it may also be present in this embodiment.

The alternative embodiment illustrated in FIG. 6 differs from the embodiments described earlier, by how the active layer 23 is formed and transferred onto the receiver substrate 1 on the one hand and by the embodiment of the ground plane 5 on the other hand.

In FIGS. 6B and 6C, it may be seen that the embrittlement area 21' consists of a porous layer.

The latter delimits the active layer 23 from the remainder 22 of the donor substrate.

For the embodiment of this porous area, reference may be made to the literature relating to the method known under the name of ELTRAN and to the aforementioned book of S. S. Lyer and A. J. Auberton-Hervé.

Moreover, in this embodiment, the insulator layer 4 was not formed or deposited on the donor substrate 2. However it might also be present without departing from the scope of the invention.

The step illustrated in FIG. 6C differs from the one illustrated in FIG. 4C in that the implantation of the atoms and/or ions of the aforementioned metal, (for example a refractory metal) is carried out through a mask 6.

The thereby obtained ground plane bears the reference 5'. The method for obtaining it, is described in detail later on.

Only three exemplary embodiments of the method according to the invention have been described in connection with FIGS. 4, 5 and 6. However, it should be noted that the insulator layers 3 and 4 may equally be provided on the receiver substrate 1 or the donor substrate 2 or on the both of them, from the moment that at least one insulator layer is provided, so as to obtain at the end of the method a substrate of the semiconductor on insulator SeOI type.

Moreover, it is possible to equally combine one of the transfer methods of the active layer 23, i.e. for example Smart Cut™, BESOI or ELTRAN with one of the embodiments of the ground plane, i.e. a ground plane formed either in the vicinity of the front face 10, or in depth in the receiver substrate 1 (i.e. buried and extending over a certain thickness but away from the front face 10) and which appears either as distinct areas or islands, or as a unique plane, the circumference of which coincides with that of the receiver substrate 1.

The different phases of the method will now be described in more detail.

Insulating Layer(s).

The insulator layers 3 and 4 are for example made in silicon oxide ($SiO_2$), in silicon nitride ($Si_3N_4$) or in silicon oxynitride ($Si_xO_yN_z$).

It is also possible to use for the insulator layer 3 or 4, dielectric materials with strong permittivity (high k), such as for example hafnium dioxide ($HfO_2$), alumina ($Al_2O_3$), zirconium oxide ($ZrO_2$), tantalum pentoxide ($Ta_2O_5$), titanium dioxide ($TiO_2$), their nitrides and their silicides.

The thickness of the insulator layers 3 and 4 is generally comprised between 10 nm and 200 nm.

However, when it is desired to obtain a final substrate of the UTBOX type, it will be ensured that the thickness of the insulator layer alone 3 (i.e. when there is no layer 4) or of the layer 4 alone (i.e. when there is no layer 3) or of the sum of both of these layers (when they are both present) does not exceed 50 nanometers, preferentially does exceed 25 nanometers.

The insulator layers 3 and 4 may be formed or deposited or be native. In the latter case, they are formed by natural oxidation of the material in free air.

When the insulator layer 3 or 4 is formed, it is formed by thermal oxidation of the donor substrate 2 or of the receiver substrate 1, this oxidation being conducted at temperatures comprised between 700° C. and 1,000° C. In this case, the obtained insulator layer is an oxide of the constitutive semiconducting material of the substrate 1 or 2. This technique is simple to apply, but makes the nature of the insulator layer dependent on that of the substrate on which it is formed.

As an example, a layer of silicon oxide ($SiO_2$) may be obtained by a heat treatment under oxygen, of a silicon substrate, at a temperature of 900° C., for duration of 30 minutes, until the desired thickness is obtained as this will be described later on.

The insulator layers 3 and 4 may also be deposited, so that their chemical nature cannot be related to that of the substrate which supports them. Thus, a $SiO_2$ layer may be deposited on a germanium (Ge) or silicon carbide (SiC) substrate, for example.

Among the deposition techniques, mention may be made of Chemical Vapor Deposition known under the acronym CVD.

Low Pressure Chemical Vapor Deposition known under the acronym LPCVD, or a method for depositing atomic layers, known under the acronym ALD (Atomic Layer Deposition) or further Plasma Enhanced Chemical Vapor Deposition known under the acronym of PECVD, may also be used.

If the insulator layer 3, 4 is a $SiO_2$ layer, it is also possible to proceed with its deposition by the aforementioned LPCVD technique, but from a precursor of the tetraethyl orthosilicate (TEOS) type, this technique being known under the acronym of LPCVD TEOS.

To do this, tetraethyl orthosilicate ($Si(OC_2H_5)_4$) is introduced as a gas, inside the enclosure of the chemical vapor deposition reactor. Under the action of the temperature and pressure, the latter decomposes as follows:

$$Si(OC_2H_5)_4(gas) \rightarrow SiO_2(solid) + 2C_2H_4(gas) + 2CH_3CH_2OH\ (gas)$$

As an example, by maintaining the pressure inside the enclosure between 200 mtorrs (millitorrs) and 1 torr (i.e. between 26.6 Pa and 133.3 Pa) and the temperature between 600° C. and 750° C., for a duration of about 5-30 minutes, an $SiO_2$ thickness may be obtained comprised between 10 nm and 200 nm, (nanometers).

By maintaining the pressure inside the enclosure between 200 mtorrs (millitorrs) and 500 mtorrs (millitorrs), (i.e. between 26.6 Pa and 66.66 Pa), preferably to 250 millitorrs (33.33 Pa) and the temperature between 500° C. and 750° C., preferably to 650° C., for a duration comprised between 10 to 20 minutes, preferably of 15 minutes, an $SiO_2$ thickness of 50 nm is obtained.

Formation of the Ground Plane Inside the Receiver Substrate.

This step consists of implanting into the receiver substrate 1, atoms and/or ions of at least one metal, preferably a refractory metal, still preferably selected from cobalt, nickel, titanium, tantalum, tungsten, and molybdenum.

The doses and the implantation energies are selected depending on the chemical and crystallographic nature of the receiver substrate 1, on the depth at which it is desired to form the ground plane and on the desirably obtained density and thickness.

Preferably, the atoms and/or ions of said metal will be implanted with a dose comprised between $1 \cdot 10^{14}$ at/cm$^2$ and $1 \cdot 10^{16}$ at/cm$^2$ and an energy comprised between 50 keV and 1,500 keV.

The energy of the implantation will depend on the depth at which the ground plane is formed and therefore on the thickness of the insulator at the surface. Typically, for thin oxides of the UTBOX type, which have a thickness less than 50 nm, the implantation energy range will be comprised between 50 and 200 keV. For insulator thicknesses above 50 nm, the preferential implantation energy range is comprised between 250 and 500 keV.

This step is applied in any kind of commercially available ion implanter.

The thereby formed ground plane extends over a thickness which corresponds to a fraction of the total thickness of the receiver substrate 1.

After the implantation step, a heat treatment is applied at a temperature larger than or equal to 900° C. and less than or equal to 1,100° C., for at least one minute. The temperature and time are selected depending on the depth and on the dose at which the aforementioned ions and/or atoms have been implanted. The heat treatment may be carried out under a neutral atmosphere, preferably an argon and/or nitrogen atmosphere.

Strong implantation doses of the metal lead to the use of a larger heat balance. Typically, for all the aforementioned metals, doses above $2 \cdot 10^{15}$ at/cm$^2$ lead to the use of temperatures above 750° C. for durations longer than 30 minutes. This heat treatment has the purpose of homogenizing the distribution of the metal atoms within the thereby formed ground plane and obtaining an alloy of the semiconducting material of the substrate with the implanted metal(s).

Finally, it will be noted that optionally, the insulator layer 3 possibly formed before the metal implantation step, may be suppressed before the heating step, so that it will no longer be present in the final substrate obtained.

Implantation may also be achieved through a mask 6, for example formed by one of the polymer resins used in standard photolithography.

In this case, only the ions and/or atoms which have crossed the mask will attain the interior of the receiver substrate 1 where they will form a ground plane 5' in the form of islands.
Cleaning Before Bonding.

Preferably, the faces to be adhered to the donor and receiver substrates are subjected to "RCA" type cleaning, in order to remove contaminating particles.

As a reminder, the treatment with a chemical bath designated as "RCA" consists of treating said faces, successively with:
- a first bath of a solution known under the acronym SC1, (Standard Clean 1 which means a standard cleaning solution 1), and which comprises a mixture of ammonium hydroxide (NH$_4$OH), hydrogen peroxide (H$_2$O$_2$) and deionized water,
- a second bath of a solution known under the acronym SC2, (Standard Clean 2, which means a standard cleaning solution 2), and which comprises a mixture of hydrochloric acid (HCl), hydrogen peroxide (H$_2$O$_2$) and deionized water.

The thereby cleaned substrates are then brushed and/or rinsed with deionized water for example.
Plasma Activation:

Either one or both of the faces to be bonded to the receiver 1 and donor 2 substrates may be submitted to a plasma activation treatment, under an inert atmosphere, for example containing argon or nitrogen, or under an atmosphere containing oxygen. This activation is preferably carried out after cleaning and before bonding.

The conditions are specified hereafter:

Generally, the specified power values in the description which follows are given for applications to wafers with a diameter of the order of 200 mm. However, the present invention also applies to wafers with a diameter of the order of 300 mm, by adapting the power of the plasma (or the power density values).

Thus, generally, the power density is comprised between 0.035 W/cm$^2$ and 10 W/cm$^2$, preferably 0.4 W/cm$^2$ for argon, 0.8 W/cm$^2$ for nitrogen, and 0.8 W/cm$^2$ for oxygen.

For a treatment under an argon containing atmosphere:
the power is comprised between 25 and 2,500 W, preferably, it is 125 W for a wafer of 200 mm or about 200 W for a wafer of 300 mm (corresponding to a power density of 0.4 W/cm$^2$),
the pressure is comprised between 20 millitorrs and 100 millitorrs, preferably it is 50 millitorrs (1 torr=133.32 Pa),
the gas flow rate is comprised between 0 and 100 sccm, preferably it is 100 sccm,
the exposure time is comprised between 5 s and 5 min, preferably it is 30 s.
For a treatment under an atmosphere containing nitrogen:
the power is comprised between 25 and 2,500 W, preferably, it is 250 W (corresponding to a power density of 0.8 W/cm$^2$),
the pressure is comprised between 20 millitorrs and 100 millitorrs, preferably it is 50 millitorrs,
the gas flow rate is comprised between 0 and 100 sccm, preferably it is 100 sccm,
the exposure time is comprised between 5 s and 5 min, preferably it is 30 s.

During plasma activation, the power density supplied to the plasma is adapted to the gas used.

Indeed, as argon atoms are bigger than nitrogen atoms, the retained power for applying an argon plasma will be more limited than for a nitrogen plasma, in order to avoid a spraying effect of the argon.

For a treatment under an atmosphere containing oxygen:
the power is comprised between 25 and 2,500 W, preferably, it is 530 W,
the pressure is comprised between 20 millitorrs and 100 millitorrs, preferably it is 50 millitorrs,
the gas flow rate is comprised between 0 and 100 sccm, preferably it is 75 sccm,
the exposure time is comprised between 5 s and 5 min, preferably it is from 30-45 s.

The faces 1, 2 to be bonded of each substrate may be treated with plasmas of identical or different chemical natures.

Preferentially, the donor substrate 2 is submitted to oxygen plasma activation after cleaning.

Another preferred method consists of submitting the donor substrate 2 to activation under oxygen, whereas the receiver substrate 1 (if it does not include an insulator layer 3 of the oxide type) is treated by a non-oxidizing plasma, under nitrogen or argon.
Bonding:

The wafers of the substrates 1 and 2 are put into contact with each other at room temperature so as to achieve bonding by molecular adhesion.
Finishing:

After removing or detaching the remainder 22, the obtained SeOI type substrates may optionally be subjected to a finishing treatment. The latter for example comprises cleaning, oxidation/deoxidation, polishing steps, or a heat treatment step such as Rapid Thermal Annealing known under the acronym RTA in order to obtain a finished product of very high quality.
Treatment for Forming a UTBOX.

The obtained substrates may be submitted to a heat treatment for dissolving a portion of the insulator layer(s) 3, 4, in order to obtain a substrate according to the invention but of the "UTBOX" type, i.e. in which the final insulator layer 3 or 4 or both of them is an oxide, the thickness of which is less than 50 nm, or even 25 nm.

Three exemplary embodiments of the invention are given hereafter:

Example 1

A silicon donor substrate was oxidized by thermal oxidation, so as to form a layer of silicon oxide (SiO$_2$) with a thickness of 150 nm at its surface. It was then implanted with hydrogen ions with an implantation energy of 30 keV and an implantation dose of $6 \cdot 10^{16}$ H$^+$/cm$^2$.

Titanium atoms were moreover implanted in a silicon receiver substrate with an energy of 120 keV and a dose of $5 \cdot 10^{15}$ at/cm².

The receiver substrate was then annealed at a temperature of 1,100° C. for a period of 30 minutes, under a nitrogen atmosphere, so as to define a titanium silicide ground plane thereon with a thickness of about 75 nm.

Both donor and receiver substrates were submitted to cleaning of the aforementioned RCA type, and then adhered against each other by molecular adhesion.

Detachment of the remainder of the donor substrate was carried out by applying a heat treatment between 200° C. and 600° C. Finally, the obtained substrate was subjected to a finishing step.

A substrate of the SOI type was thereby obtained, in which a ground plane consisting of titanium silicide $TiSi_x$ with $1 < x < 2$ was formed.

Example 2

A silicon donor substrate was oxidized by thermal oxidation, so as to form a layer of silicon oxide ($SiO_2$) with a thickness of 25 nm at its surface. It was then implanted with hydrogen ions with an implantation energy of 26 keV and an implantation dose of $7.2 \cdot 10^{16}$ H$^+$/cm².

A silicon receiver substrate was thermally oxidized so as to form a layer of silicon oxide ($SiO_2$) with a thickness of 80 nm at its surface.

Molybdenum atoms were moreover implanted in this receiver substrate, with an energy of 150 keV and a dose of $6 \cdot 10^{15}$ at/cm².

The receiver substrate was then annealed at a temperature of 1,050° C. for a period of 60 minutes, under a nitrogen atmosphere, so as to define a molybdenum silicide ($MoSi_2$) ground plane thereon.

The receiver substrate was then deoxidized by a 2% hydrofluoric acid HF solution.

Both donor and receiver substrates were submitted to cleaning of the aforementioned RCA type, and the donor substrate was then submitted to plasma activation under oxygen (a power of 535 W for 45 s) and finally, they were adhered against each other by molecular adhesion.

The detachment of the remainder of the donor substrate was carried out by applying a heat treatment between 200° C. and 600° C. Finally, the obtained substrate was subject to a finishing step.

An SOI type substrate was thus obtained, in which a ground plane consisting of molybdenum silicide $MoSi_x$ with $1 < x < 2$ was formed.

Example 3

A silicon donor substrate was oxidized by thermal oxidation so as to form a silicon oxide ($SiO_2$) layer with a thickness of 10 nm at its surface. It was then implanted with hydrogen ions with an implantation energy of 30 keV and an implantation dose of $6 \cdot 10^{16}$ H$^+$/cm².

Subsequently, this donor substrate was submitted to cleaning of the aforementioned RCA type, and then to plasma activation under oxygen, (a power of 535 W for 45 s).

A silicon receiver substrate was thermally oxidized so as to form a silicon oxide ($SiO_2$) layer with a thickness of 10 nm at its surface.

Titanium atoms were moreover implanted in this receiver substrate, with an energy of 120 keV and a dose of $5 \cdot 10^{15}$ at/cm².

The receiver substrate was then annealed at a temperature of 1,100° C. for a period of 30 minutes, under a nitrogen atmosphere so as to define a titanium silicide ground plane thereon.

Both of the donor and receiver substrates were finally submitted to cleaning by brushing, and then adhered against each other by molecular adhesion.

The detachment of the remainder of the donor substrate was carried out by applying a heat treatment between 200° C. and 600° C. Finally, the obtained substrate was subject to a finishing step.

An SOI type substrate was thereby obtained, in which a ground plane consisting of titanium silicide $TiSi_x$ with $1 < x < 2$ was formed.

What is claimed is:

1. A method for making a semiconductor on insulator (SeOI) substrate that includes an integrated ground plane under an insulating layer, which comprises:

implanting atoms or ions of at least one metal in at least one portion of a receiver substrate of semiconducting material;

carrying out a heat treatment of the receiver substrate in order to obtain an alloy of the semiconducting material and implanted metal(s) in order to form an integrated ground plane on or in at least one portion of the receiver substrate, transferring an active layer from a donor substrate of a semiconducting material onto the receiver substrate, wherein at least one layer of insulating material is inserted in between the donor and receiver substrates so as to obtain the semiconductor on insulator substrate having an integrated ground plane.

2. The method according to claim 1, wherein the implanted metal is a refractory metal.

3. The method according to claim 1, wherein the implanted metal is selected from the group consisting of cobalt, nickel, titanium, molybdenum, tungsten and tantalum.

4. The method according to claim 1, wherein the atoms or ions of metal are implanted with a dose between 1.1014 at/cm² and 1.1016 at/cm² and with an energy between 50 keV and 1,500 keV.

5. The method according to claim 1, wherein the heat treatment for forming the integrated ground plane is carried out at a temperature greater than or equal to 900° C. and less than or equal to 1,100° C. for at least one minute.

6. The method according to claim 5, wherein the heat treatment for forming the integrated ground plane is carried out under a neutral atmosphere.

7. The method according to claim 1, wherein the implantation parameters for the metal are selected such that the integrated ground plane formed in the receiver substrate extends from a front face of that substrate.

8. The method according to claim 1, wherein the implantation parameters for the metal are selected such that the integrated ground plane formed in the receiver substrate extends therein to a predetermined depth.

9. The method according to claim 1, wherein the implantation of the metal is achieved through a mask so as to form an integrated ground plane appearing as a plurality of islands.

10. The method according to claim 1, wherein the implantation of the metal is achieved over the whole surface of the receiver substrate so as to form an integrated ground plane having a circumference that is identical with that of the receiver substrate.

11. The method according to claim 1, wherein the insulator layer is formed or deposited on the donor substrate before transferring the active layer onto the receiver substrate.

12. The method according to claim 1, wherein the insulator layer is formed or deposited on the receiver substrate before implanting metal atoms or ions therein to form the integrated ground plane).

13. The method according to claim 1, wherein the insulating material is selected from the group consisting of silicon oxide (SiO2), silicon nitride (Si3N4) and a silicon oxynitride SixOyNz.

14. The method according to claim 1, wherein the transfer of the active layer is carried out by bonding the donor substrate onto the receiver substrate by molecular adhesion and by then submitting the free or rear face of the donor substrate to mechanical thinning, chemical thinning or ion etching so as to reduce the thickness of the donor substrate until a desired thickness of the active layer is obtained.

15. The method according to claim 1, wherein the transfer of the active layer is carried out by providing a porous area in the donor substrate and bonding the donor substrate onto the receiver substrate by molecular adhesion, and by then submitting the donor substrate to the application of stresses so as to detach a remainder portion from the donor substrate and to retain on the receiver substrate a desired thickness of the active layer.

16. The method according to claim 1, wherein the transfer of the active layer is carried out by implanting atomic or ionic species in the donor substrate so as to form an embrittlement area therein, and by then bonding the implanted donor substrate by molecular adhesion onto the receiver substrate and further by then applying stresses to the donor substrate so as to detach a remainder portion therefrom and to only retain on the receiver substrate a desired thickness of the active layer.

17. The method according to claim 1, wherein the donor substrate and receiver substrate are made of at least one semiconducting material selected from the group consisting of silicon (Si), silicon carbide (SiC), germanium (Ge), gallium nitride (GaN) and gallium arsenide (AsGa).

18. The method according to claim 1, wherein the donor substrate and receiver substrate are made of silicon and the insulator is silicon oxide (SiO2).

19. The method according to claim 1, wherein the insulator layer has a thickness that does not exceed 50 nanometers so as to obtain a substrate having a buried ultra thin insulator layer of the UTBOX type.

* * * * *